United States Patent [19]

Reihl et al.

[11] 4,339,869

[45] Jul. 20, 1982

[54] METHOD OF MAKING LOW RESISTANCE CONTACTS IN SEMICONDUCTOR DEVICES BY ION INDUCED SILICIDES

[75] Inventors: Robert F. Reihl, Gloversville, N.Y.; Kang-Lung Wang, Santa Monica, Calif.

[73] Assignee: General Electric Company, Schenectady, N.Y.

[21] Appl. No.: 187,043

[22] Filed: Sep. 15, 1980

[51] Int. Cl.³ .................. H01L 29/72; H01L 21/285; H01L 21/265
[52] U.S. Cl. ............................. 29/576 B; 148/1.5; 148/187; 357/65; 357/67; 357/91; 427/84; 427/87
[58] Field of Search ............... 148/1.5, 187; 29/576 B; 357/65, 67, 91; 427/84, 87

[56] References Cited

U.S. PATENT DOCUMENTS

| | | | |
|---|---|---|---|
| 3,753,774 | 8/1973 | Veloric | 427/88 |
| 3,964,084 | 6/1976 | Andrew, Jr. et al. | 357/15 |
| 4,141,022 | 2/1979 | Sigg et al. | 357/67 |
| 4,263,058 | 4/1981 | Brown et al. | 427/88 |
| 4,276,688 | 7/1981 | Hsu | 427/88 |
| 4,283,437 | 8/1981 | Higashinakagawa et al. | 357/67 |

OTHER PUBLICATIONS

B. Y. Tsauer, Z.L. Liau and J. W. Mayer, Ion–beam–induced Silicide Formation, Appl. Phys. Letter 15, Jan. 1979, pp. 168-170.
Nishi et al. in Ion-Implantation in Semiconductors Ed. S. Namba, Plenum, N.Y. 1974, pp. 347-354.
Ottavianai et al., Phys. Rev. Letts. 44 (Jan. 1980), 284.
Berenbaum et al., IBM-TDB, 22 (Jan. 1980), 3206.
Hodgen, IBM-TDB, 23 (Jun. 1980), 373.

Primary Examiner—Upendra Roy
Attorney, Agent, or Firm—Julius J. Zaskalicky; James C. Davis, Jr.; Marvin Snyder

[57] ABSTRACT

A low resistance electrical contact is made to a silicon substrate by forming a layer of a refractory metal on the substrate and thereafter applying a dosage of ions through the layer of refractory metal to the substrate to form a layer of a compound of the refractory metal and silicon at the interface of the layer of refractory metal and the silicon substrate.

15 Claims, 15 Drawing Figures

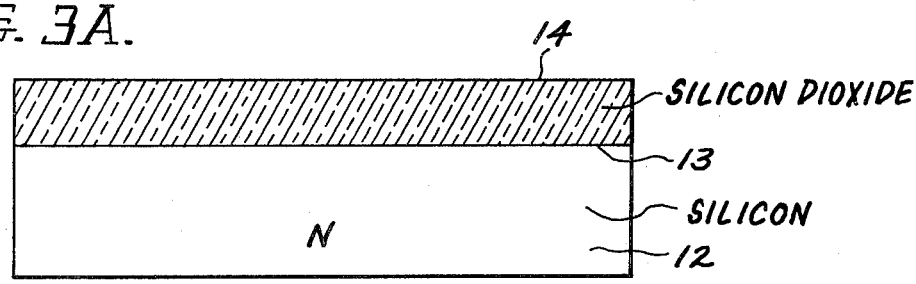
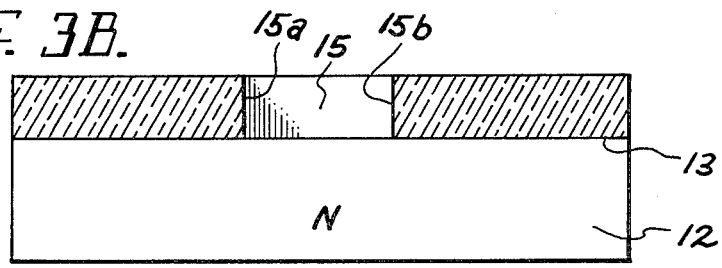
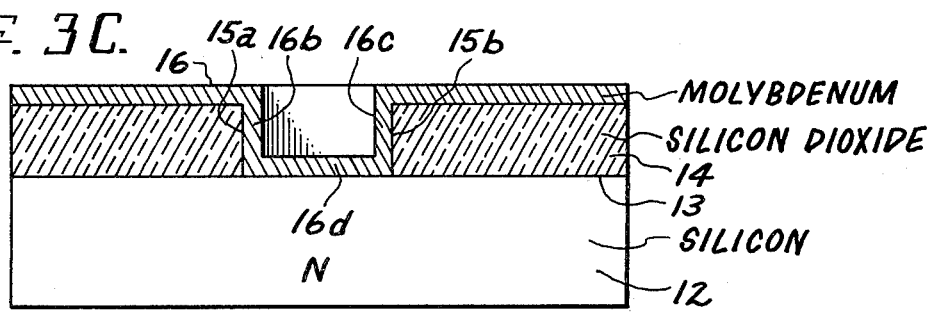
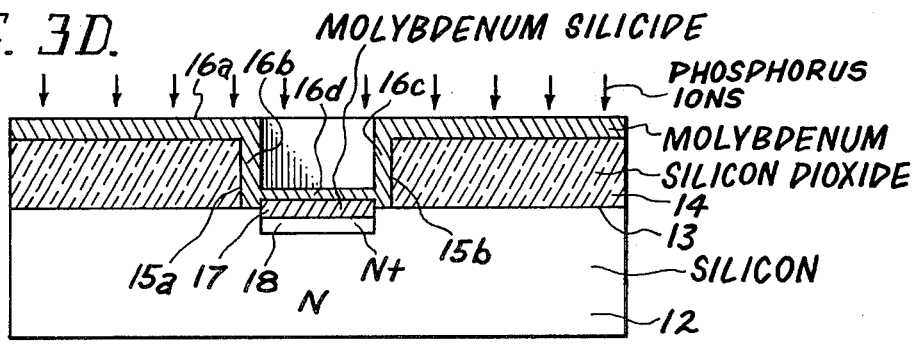
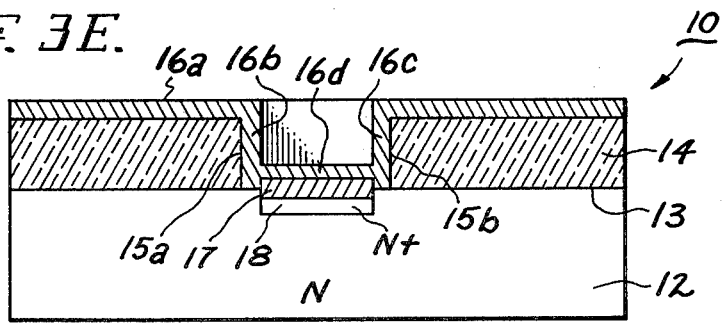

METHOD OF MAKING LOW RESISTANCE CONTACTS IN SEMICONDUCTOR DEVICES BY ION INDUCED SILICIDES

The present invention relates in general to silicon integrated circuit devices and, in particular, to a method of making low electrical resistance contacts in such devices.

As the density of circuit elements in integrated circuit devices and the speed of operation thereof is increased, the resistivity of the electrodes, the resistivity of the interconnection lines, and the resistivity of the electrical contacts to the circuit elements must be decreased. Refractory metals such as molybdenum have heretofore been utilized to provide the electrodes and interconnection lines for such devices. Bonding of the interconnection lines of refractory metals such as molybdenum to a silicon substrate to provide ohmic connections thereto have heretofore been accomplished by essentially mechanical means. In such prior art techniques, the portion of the silicon semiconductor substrate to which a contact is made is exposed by removal of the insulating layer thereon. Preferably, this includes removal also of a very thin layer of silicon dioxide thereon which is readily formed on the exposed surface of silicon at 25° C. in the presence of oxygen. The exposed portion of the substrate is heavily doped so that a Schottky diode contact can be made thereto in which conduction occurs predominantly by election tunneling. The refractory metal is then deposited on the exposed portion to provide the ohmic connection thereto. In the case of molybdenum, while a relatively low resistance contact can be made by such means, it has been found that such contacts not only have poor adhesion but also the resistance of such contacts increases substantially with subsequent high temperature processing thereof.

Accordingly, an object of the present invention is to provide an improved method of making low electrical resistance contacts of a refractory metal to silicon substrates.

Another object of the present invention is to provide a method of making low resistance electrical contacts to silicon substrates which are uniform, readily reproducible, and reliable.

A further object of the present invention is to provide a method of forming other elements of silicon semiconductor devices concurrently with the formation of low resistance electrical contacts thereto.

In carrying out the present invention in an illustrative embodiment thereof, there is provided a substrate of silicon semiconductor material having a major surface. A layer of a refractory metallic material selected from the class consisting of molybdenum and tungsten is formed over a portion of the major surface of the silicon substrate. A dosage of ions of one conductivity inducing type is applied through the layer of refractory metallic material to the substrate to form a layer of a compound including the refractory metal and silicon at the interface of the layer of refractory metal and the substrate and also to form a region of one conductivity type in the substrate contiguous to the layer of refractory metal compound. The dosage utilized is sufficiently large to provide a net activator concentration to the aforementioned region which enables conduction between the layer of refractory metal silicide and the aforementioned region to occur predominantly by electron tunneling.

The novel features which are believed to be characteristic of the present invention are set forth with particularity in the appended claims. The invention, itself, however, both as to its organization and method of operation, together with further objects and advantages thereof, may best be understood by reference to the following description taken in connection with the accompanying drawings wherein:

FIGS. 3A–3E show cross sections of structures representing successive steps in one method of fabricating the composite body of FIGS. 1 and 2 in accordance with the present invention.

Figure 1:
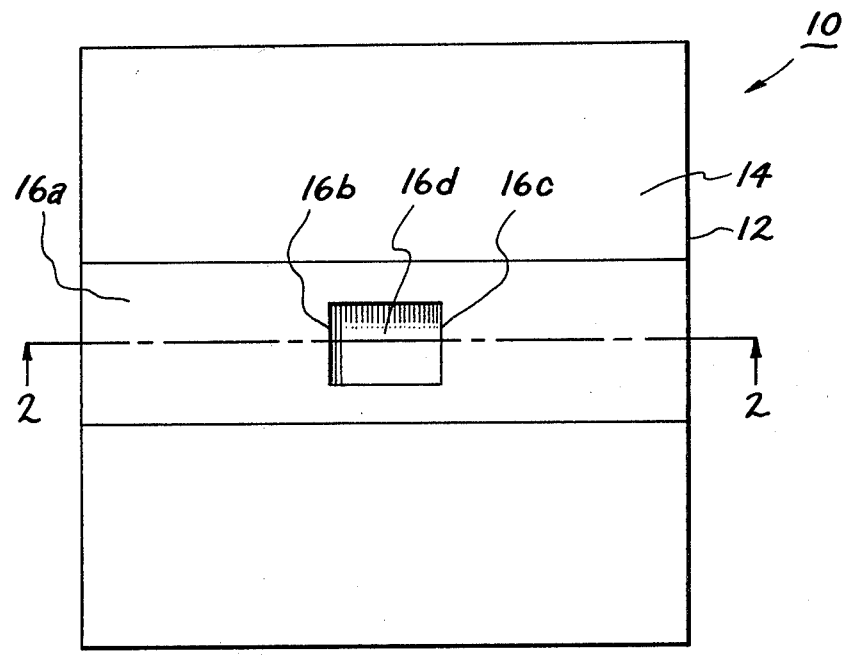
FIG. 1 is a plan view of a composite body which includes a substrate of silicon semiconductor material to which low resistance electrical contact is made in accordance with the present invention.
Figure 2:
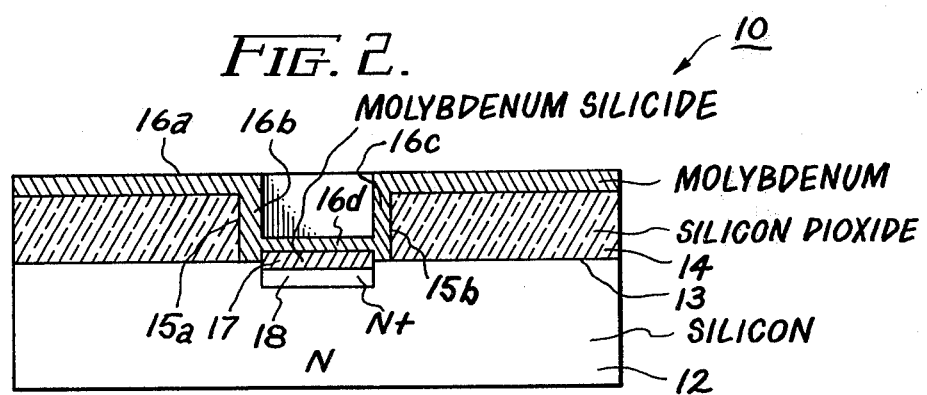
FIG. 2 is a cross-sectional view of the body of FIG. 1 taken along section lines 2—2 thereof.

Referring now to FIGS. 1 and 2, there is shown a composite structure 10 representing a portion or section of an integrated circuit device and illustrating an electrical connection made in accordance with the present invention. The structure 10 includes a substrate 12 of N-type conductivity silicon having a major surface 13. A thick layer 14 of silicon dioxide is provided overlying the surface of the semiconductor substrate. An opening 15 is provided in the insulating layer 14 extending to the surface of the substrate and having a pair of side walls 15a and 15b. A conductive line 16a of molybdenum is provided overlying the insulating layer 15 and extending into the opening 15. The conductive line has a portion 16b contiguous to side wall 15a and another portion 16c contiguous to the side wall 15b and has a base portion 16d connecting the bottom portions of the portions 16b and 16c. Underlying the base portion 16d is a layer 17 of molybdenum silicide bonded thereto. The underside of the layer of molybdenum silicide is in turn bonded to a surface adjacent region of N-type conductivity 18 in the substrate 12. The substrate 12 is constituted of silicon having a resistivity suitable for the formation of integrated circuit devices therein. The N-type region 18 is provided with a net activator concentration sufficiently high denoted by the symbol N+ to form a metal-semiconductor contact with the layer of molybdenum silicide such that conduction between the region 18 and the region 17 occurs predominantly by electron tunneling. The layer 17 may conveniently be several hundred Angstroms thick. The molybdenum line may be conveniently on the order of 1000 Angstroms thick. The composite structure 10 illustrates an ohmic connection made between a line 16a and the substrate 12 on which other integrated circuit elements (not shown) are included.

A method of fabricating the composite structure 10 of FIGS. 1 and 2 will now be described in connection with FIGS. 3A–3E. Elements of FIGS. 3A–3E identical to elements of FIGS. 1 and 2 are identically designated. A substrate 12 of N-type silicon semiconductor material having a resistivity of about 10 ohm-cm and about 10 mils thick is provided. Conveniently, the substrate is provided with a major surface 13 parallel to a (100) crystallographic plane. A layer 14 of silicon dioxide about 6000 Angstroms thick is thermally grown on the major surface 13, as shown in FIG. 3A. A rectangular opening 15 is made in the layer 14 extending to the major surface 13, as shown in FIG. 3B, using photolithographic masking and etching techniques well known in the art. The surface 13 is sputter etched in a low pressure inert atmosphere to assure a silicon surface substantially free of silicon dioxide. Silicon surfaces have a thin layer of native silicon oxide formed thereon when exposed to oxygen even at room temperatures. While it is preferably to remove such native oxide, the efficacy of the process of the present invention is not substantially affected by its presence. Thereafter, a layer 16 of molybdenum approximately 1000 Angstroms thick is deposited by sputtering on the exposed portion of the surface 13 of the semiconductor substrate 10 maintained at 300° C. and also on the surrounding insulating layer as well, as shown in FIG. 3C.

The layer 16 of molybdenum is then patterned using photolithographic masking and etching techniques well known in the art to provide the conductive line 16a, as shown in FIG. 3D (also FIG. 1). A dosage of phosphorous ions is next applied through the molybdenum layer in the opening 15 into the substrate, as shown in FIG. 3D. While the applied beam of phosphorous ions extends beyond the area of the opening, areas of the surface of the substrate not underlying the opening are shielded by the relatively thick layer 14 of silicon dioxide and the layer 16 of molybdenum. The ions are provided with an energy to assure penetration of the ions through the molybdenum line and into the portion of the substrate underlying the opening 15. The energy of the ions is set so that the projected range, that is, the average distance of travel, lies substantially at the interface between the molybdenum layer 16 and the major surface 13. A suitable energy for the phosphorous ions to enable penetration of the molybdenum layer is 250 keV (kiloelectron volts). The dosage of ions applied is set to provide not only a intermetallic compound of molybdenum and silicon but also a net activator concentration in the surface adjacent region of the substrate sufficiently high to form a Schottky barrier contact in which conduction occurs predominantly by electron tunneling, as will be described hereinafter. The range of dosages which may be utilized are from about $10^{15}$ to about $10^{17}$ ions $cm^{-2}$. Utilizing an ion beam having a current or flux density of $2 \times 10^{13}$ ions $cm^{-2}$ $sec^{-1}$, a dosage of $10^{15}$ ions $cm^{-2}$ would be provided in about 50 seconds. Utilizing an ion beam having a current or flux density of $3 \times 10^{13}$ ions $cm^{-2}$ $sec^{-1}$, a dosage of $10^{17}$ ions $cm^{-2}$ would be provided in about 55.55 minutes.

Three groups of contacts, each contact having an area of 0.01 $cm^2$ were made at a temperature 25° C. in the manner described above using respective dosages of $10^{15}$, $10^{16}$ and $10^{17}$ ions $cm^{-2}$. The contact resistivity between the molybdenum line and the silicon substrate for each of the contacts of the three groups was measured. For each of the contacts of the group formed with a dosage of about $10^{15}$ ions $cm^{-2}$, a contact resistivity of substantially 10 microohms $cm^2$ was obtained. For each of the contacts of the groups formed with a dosage of about $10^{16}$ ions $cm^{-2}$, a contact resistivity of substantially 1 microohm $cm^2$ was obtained. (The value of 1 microohm $cm^2$ of contact resistivity is about the value of contact resistivity obtained by alloying aluminum conductors to silicon substrates.) For each of the contacts of the group formed with a dosage of about $10^{17}$ ions $cm^{-2}$, a contact resistivity of substantially 1 microohm $cm^2$ was obtained. Each of the three groups of contacts was subsequently annealed at a temperature of about 1000° C. for 30 minutes and the contact resistivity was again measured. For the contacts made with a dosage of $10^{15}$ ions $cm^{-2}$, the contact resistivity was reduced to substantially 1 microohm $cm^2$. For the contacts made with dosages of $10^{16}$ and $10^{17}$ ions $cm^{-2}$, the contact resistivity remained at substantially 1 microohm $cm^2$.

Contacts of molybdenum to silicon were also made under conditions identical to the conditions described above at 25° C. except that the three different dosages of $10^{15}$, $10^{16}$, and $10^{17}$ ions $cm^{-2}$ were applied to silicon substrates maintained at −196° C. and were found to have substantially the same contact resistivities as described above for contacts made at 25° C. Contacts of molybdenum to silicon were also made under conditions identical to the conditions described above at 25° C. except that the three different dosages were applied to silicon substrates maintained at 150° C. and were found to have substantially the same contact resistivities as described above for contacts made at 25° C.

With respect to the manner of forming the contacts in accordance with the present invention, ions having the energy indicated pass through the layer of molybdenum and through any thin layer of silicon dioxide which may be located at the interface between the molybdenum conductor and the substrate. The bombardment of ions produces defects in the crystalline structure of the silicon substrate adjacent the surface displacing atoms therein. Any silicon dioxide layer on the surface of the substrate is also pierced and broken up. Under these conditions, the molybdenum and silicon atoms intermix and combine to form a compound at the interface. With a sufficiently high dosage, the interaction produces a layer 17 of molybdenum disilicide, as shown in FIG. 3D. At the same time an increased concentration of donor activators in the surface adjacent region 18 of the substrate is produced converting this region into strongly N-type conductivity. Thus, a conductive contact of molybdenum disilicide layer 17 which is bonded on one side to the layer of molybdenum and on the other side to the N-type region 18 is formed. This is referred to as a metal-semiconductor contact or a Schottky diode. When the net activator concentration of the N-type region is made sufficiently high, i.e. of the order of $10^{20}$ atoms per $cm^3$, conduction between these layers occurs by electron tunneling thereby providing low ohmic resistance between them.

While in the embodiment described above, ions of phosphorus are used, ions of other Group V elements may be utilized, such as arsenic. Arsenic ions would be provided with the energy required to penetrate the molybdenum layer and to penetrate on average to the interface between the molybdenum layer and the semiconductor substrate. For a molybdenum layer 500 Angstroms thick an energy of 230 keV (kiloelectron volts) would be used. Again the dosage would be sufficient to form the conductive layer of molybdenum silicide and to provide a net activator concentration sufficiently high to provide conduction by electron tunneling between the layer of molybdenum silicide and this region.

While in the embodiment described above the contact was formed on a (100) surface of the silicon substrate, it is apparent that surfaces having other orientations may be utilized.

While in the example above, the invention has been described in connection with the provision of low resistance electrical connection between a conductor of molybdenum to a semiconductor substrate of silicon of N-type conductivity, it is apparent that low resistance electrical contact can be made to silicon substrates of P-type conductivity as well. However, in the latter case, instead of using donor ions selected from Group V of the Periodic Table, acceptor ions of Group III of the Periodic Table would be used. Conveniently, boron would be a suitable element. Boron ions would be provided with the energy required to penetrate the molybdenum layer and to penetrate on average to the interface between the molybdenum layer and the semiconductor substrate. For a molybdenum layer 1000 Angstroms thick, an energy of 90 keV volts would be used. Again a sufficient dosage would be applied to form the conductive layer of molybdenum silicide and to provide a net activator in the region adjacent the surface of the substrate concentration sufficiently high to provide conduction predominantly by electron between the layer of molybdenum silicide and this region.

Also, a region of opposite conductivity type can be formed in a semiconductor substrate of one conductivity type concurrently with the formation of an ohmic connection to the semiconductor substrate by applying a dosage of ions of the opposite conductivity inducing type through refractory metal layer to the substrate. A layer of refractory metal silicide is formed at the interface of the layer of refractory metal and the substrate and a region of the opposite conductivity type is formed in the substrate contiguous to the refractory metal silicide layer. Of course, subsequent annealing would be utilized to repair the damage done to the silicon substrate by the implantation and to activate the ions implanted therein.

While the invention has been described and illustrated in connection with a composite structure in which the conductive layer 16 is constituted of molybdenum, it is apparent that in view of the similarity of the compounds of molybdenum, particularly the silicides thereof, to the compounds of tungsten, the conductor 16 may be constituted of tungsten as well.

While the invention has been described in specific embodiments, it will be understood that modifications, such as those described above, may be made by those skilled in the art and it is intended by the appended claims to cover all such modifications and changes as fall within the true spirit and scope of the invention.

What we claim as new and desire to secure by Letters Patent of the United States is:

1. The method of forming an electrical contact comprising:
providing a substrate of silicon semiconductor material having a major surface,
forming a layer of a refractory metal selected from the class consisting of molybdenum and tungsten over a portion of said surface of said substrate,
implanting dosage of ions of one conductivity inducing type through said layer of refractory metal and into said substrate to form a layer of a compound including said refractory metal and said silicon semiconductor material at the interface of said layer of refractory metal and said substrate and to form a region of said one conductivity type in said substrate contiguous to said layer of said compound, said dosage being sufficiently large to provide a net activator concentration in said region whereby conduction between said layer of said compound and said region occurs predominantly by electron tunneling.

2. The method of claim 1 in which the energy of said ions is set to provide an average penetration of said ions to said major surface of said substrate.

3. The method of claim 1 in which the dosage of said ions is in the range from about $10^{15}$ to about $10^{17}$ ions cm$^{-2}$.

4. The method of claim 1 in which said substrate and said layer of refractory metallic material is maintained at less than about 150° C. while said dosage of ions is being implanted thereinto.

5. The method of claim 3 including the step of annealing said substrate exposed to a dosage at the lower end of said range of dosages at a temperature less than about 1000° C. for a time to decrease the resistance between said layer and said substrate.

6. The method of claim 1 in which said portion of said major surface of said substrate includes a thin layer of silicon dioxide, said layer of refractory metallic material overlying said thin layer of silicon dioxide, and in which said dosage is implanted through said thin layer of silicon dioxide.

7. The method of claim 1 in which said substrate is of said one conductivity type in the vicinity of said portion of said major surface and of said region.

8. The method of claim 1 in which said substrate is of opposite conductivity type in the vicinity of said portion of said major surface and of said region.

9. The method of claim 1 in which said refractory metallic material is molybdenum.

10. The method of claim 1 in which said refractory metallic material is tungsten.

11. The method of claim 1 in which said ions are selected from the class of Group V of the Periodic Table.

12. The method of claim 11 in which said ions are phosphorus.

13. The method of claim 11 in which said ions are arsenic.

14. The method of claim 1 in which said ions are selected from the class of Group III of the Periodic Table.

15. The method of claim 14 in which said ions are boron.

* * * * *